US012630942B2

(12) United States Patent
Fujibayashi et al.

(10) Patent No.: US 12,630,942 B2
(45) Date of Patent: May 19, 2026

(54) SEMICONDUCTOR WAFER MANUFACTURING APPARATUS

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Hiroaki Fujibayashi, Nisshin (JP); Hirotaka Mori, Nisshin (JP); Takayuki Satomura, Nisshin (JP); Shigeyuki Takagi, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 352 days.

(21) Appl. No.: 18/350,307

(22) Filed: Jul. 11, 2023

(65) Prior Publication Data

US 2024/0018687 A1 Jan. 18, 2024

(30) Foreign Application Priority Data

Jul. 13, 2022 (JP) ................................. 2022-112727

(51) Int. Cl.
*C30B 25/12* (2006.01)
*C23C 16/458* (2006.01)
(Continued)

(52) U.S. Cl.
CPC .......... *C30B 25/12* (2013.01); *C23C 16/4584* (2013.01); *C23C 16/4585* (2013.01);
(Continued)

(58) Field of Classification Search
CPC ............ C23C 16/4584; C23C 16/4585; C23C 16/4412; C30B 25/12; C30B 25/14;
(Continued)

(56) References Cited

U.S. PATENT DOCUMENTS 6,206,976 B1\* 3/2001 Crevasse ........... H01L 21/68735
118/728
2001/0052316 A1\* 12/2001 Iwata ................ C23C 16/45521
117/85
(Continued)

FOREIGN PATENT DOCUMENTS

JP H09-8108 A 1/1997
JP 2001-085356 A 3/2001
(Continued)

OTHER PUBLICATIONS

Machine Translation JP 2003-289044 (Year: 2003).\*
U.S. Appl. No. 18/350,251, filed Jul. 11, 2023, Fujibayashi et al.

*Primary Examiner* — Rodney G Mcdonald
(74) *Attorney, Agent, or Firm* — Posz Law Group, PLC

(57) ABSTRACT

A semiconductor wafer manufacturing apparatus includes a susceptor. The susceptor has a plate shape having a first surface and a second surface opposite to the first surface, and is disposed on a cylindrical member of a rotating device in such a manner that the first surface faces a reaction chamber and the second surface faces a hollow chamber surrounded by the cylindrical member and the susceptor. The susceptor has a recessed portion for accommodating a base wafer on the first surface, and the recessed portion has such a size that a gap is provided between a side surface of the recessed portion and the base wafer. The recessed portion has a bottom part and has at least one through hole penetrating through the bottom part.

11 Claims, 10 Drawing Sheets

(51) Int. Cl.

| | | |
|---|---|---|
| *C30B 25/14* | (2006.01) | |
| *C30B 25/16* | (2006.01) | |
| *H01J 37/32* | (2006.01) | |

(52) U.S. Cl.
CPC ............ *C30B 25/14* (2013.01); *C30B 25/165* (2013.01); *H01J 37/3244* (2013.01); *H01J 37/32449* (2013.01); *H01J 37/32724* (2013.01); *H01J 37/32816* (2013.01); *H01J 37/32834* (2013.01)

(58) Field of Classification Search
CPC ....... C30B 25/165; C30B 25/02; C30B 25/16; H01L 21/0262; H01L 21/67017
USPC ......................................................... 118/730
See application file for complete search history.

(56) References Cited

U.S. PATENT DOCUMENTS

| | | | |
|---|---|---|---|
| 2004/0255843 | A1 | 12/2004 | Yoshida et al. |
| 2010/0075035 | A1 | 3/2010 | Gomi et al. |
| 2020/0181798 | A1 | 6/2020 | Mabuchi et al. |

FOREIGN PATENT DOCUMENTS

| | | | |
|---|---|---|---|
| JP | 2003-289044 | * | 10/2003 |
| JP | 2007-019350 | A | 1/2007 |
| JP | 2022-066742 | A | 5/2022 |
| JP | 2022-078450 | A | 5/2022 |

* cited by examiner

SEMICONDUCTOR WAFER MANUFACTURING APPARATUS

CROSS REFERENCE TO RELATED APPLICATION

The present application claims the benefit of priority from Japanese Patent Application No. 2022-112727 filed on Jul. 13, 2022. The entire disclosure of the above application is incorporated herein by reference.

TECHNICAL FIELD

The present disclosure relates to a semiconductor wafer manufacturing apparatus.

BACKGROUND

Conventionally, there has been proposed a semiconductor wafer manufacturing apparatus for growing an epitaxial layer, which is a semiconductor layer, on a surface of a base wafer by rotating and heating the base wafer in a state where the base wafer is placed on a susceptor in a reaction chamber into which a reactant gas containing a raw material gas is introduced.

SUMMARY

The present disclosure provides a semiconductor wafer manufacturing apparatus including a susceptor. The susceptor has a plate shape having a first surface and a second surface opposite to the first surface, and is disposed on a cylindrical member of a rotating device in such a manner that the first surface faces a reaction chamber and the second surface faces a hollow chamber surrounded by the cylindrical member and the susceptor. The susceptor has a recessed portion for accommodating a base wafer on the first surface, and the recessed portion has such a size that a gap is provided between a side surface of the recessed portion and the base wafer. The recessed portion has a bottom part and has at least one through hole penetrating through the bottom part.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
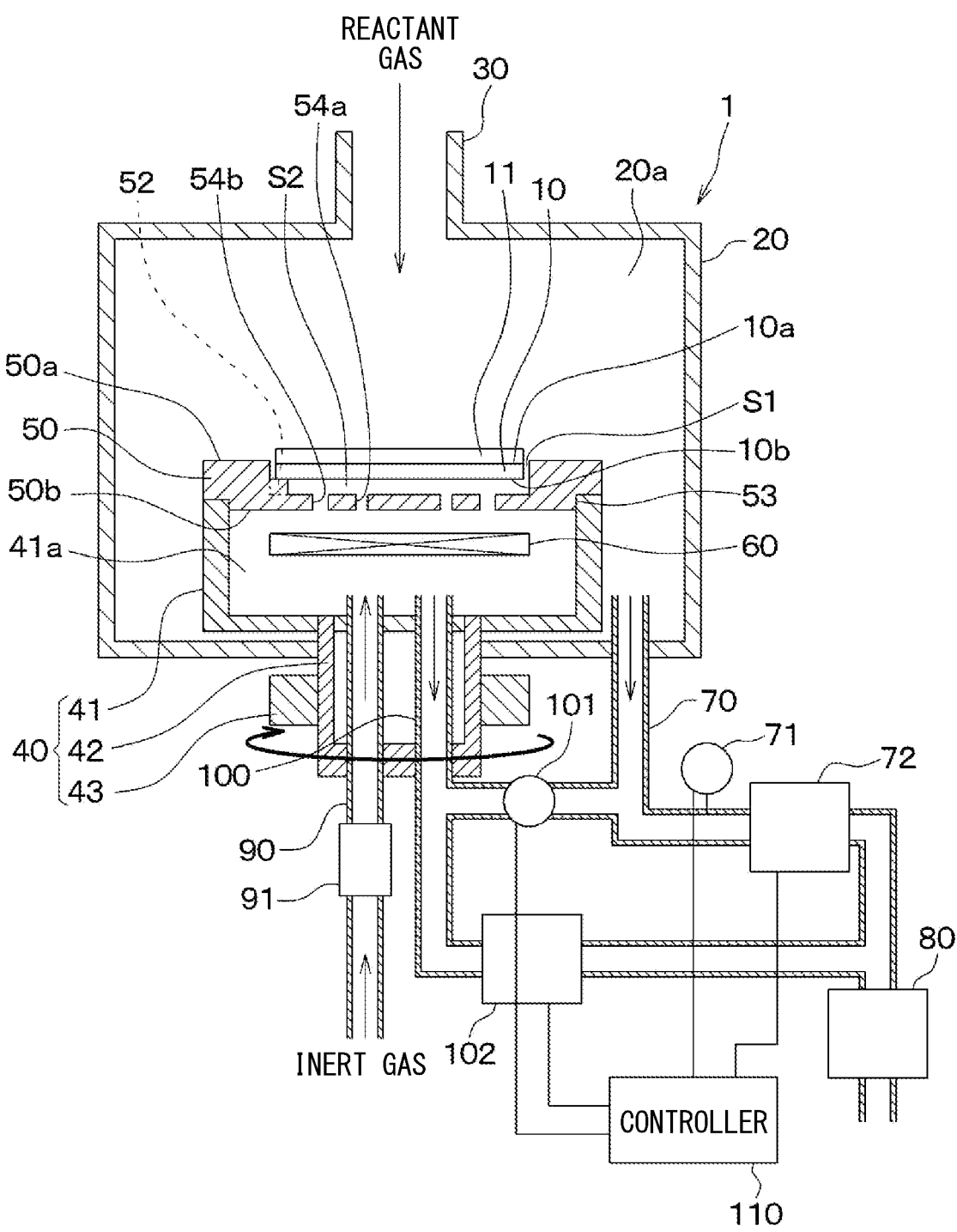
FIG. 1 is a schematic view illustrating a semiconductor wafer manufacturing apparatus according to a first embodiment.

In a semiconductor wafer manufacturing apparatus according to a related art, an epitaxial layer, which is a semiconductor layer, is grown on a front surface of a base wafer by rotating and heating the base wafer in a state where the base wafer is placed on a susceptor in a reaction chamber into which a reactant gas containing a raw material gas is introduced.

Specifically, in the semiconductor wafer manufacturing apparatus described above, the epitaxial layer is grown by causing the reactant gas to react on the front surface of the base wafer. On a rear surface side of the base wafer, an inert gas is introduced so as to restrict the reactant gas from flowing behind the rear surface of the base wafer and restrict the generation of roughness due to the reactant gas flowing behind the rear surface of the base wafer.

However, in the semiconductor wafer manufacturing apparatus described above, when the temperature of the reaction chamber becomes high, the inert gas expands, and the pressure of the inert gas increases. For this reason, in the semiconductor wafer manufacturing apparatus described above, the pressure of the inert gas flowing into the rear surface side of the semiconductor wafer becomes high, so that there is a possibility that the base wafer floats or the like, and there is a possibility that the epitaxial layer cannot be grown appropriately.

A semiconductor wafer manufacturing apparatus according to an aspect of the present disclosure includes a reaction chamber forming member, a reactant gas supply pipe, a reactant gas discharge pipe, a susceptor, a rotating device, an inert gas supply pipe, an inner gas discharge pipe, and a controller. The reaction chamber forming member forms a reaction chamber into which a reactant gas is to be introduced and in which an epitaxial layer is to be grown on a front surface of a base wafer. The reactant gas supply pipe is communicated with the reaction chamber and is configured to supply the reactant gas for growing the epitaxial layer to the reaction chamber. The reactant gas discharge pipe is communicated with the reaction chamber and is configured to discharge an unreacted gas from the reaction chamber. The susceptor is disposed in the reaction chamber and the base wafer is to be placed on the susceptor. The rotating device has a cylindrical member with one end portion on which the susceptor is disposed and is configured to rotate the susceptor together with the base wafer. A space surrounded by the cylindrical member and the susceptor is defined as a hollow chamber. The inert gas supply pipe is communicated with the hollow chamber and configured to introduce an inert gas into the hollow chamber. The inert gas discharge pipe is communicated with the hollow chamber and is configured to discharge the inert gas. The controller is configured to adjust an amount of the inert gas discharged from the inert gas discharge pipe such that a pressure in the hollow chamber is equal to or higher than a pressure in the reaction chamber and equal to or lower than a predetermined pressure. The susceptor has a plate shape having a first surface and a second surface opposite to the first surface and is disposed on the cylindrical member in such a manner that the first surface faces the reaction chamber and the second surface faces the hollow chamber. The susceptor has a recessed portion for accommodating the base wafer on the first surface, and the recessed portion has such a size that a gap is provided between a side surface of the recessed portion and the base wafer. The recessed portion has a bottom part and has at least one through hole penetrating the bottom part.

According to the above configuration, the pressure in the hollow chamber is set to be equal to or higher than the pressure in the reaction chamber and equal to or lower than the predetermined pressure. Therefore, by setting the predetermined pressure to a pressure at which the base wafer does not float, floating or the like of the base wafer during growth of the epitaxial layer can be restricted, and growth of the epitaxial layer can be suitably performed.

Embodiments of the present disclosure will be described below with reference to the drawings. In the following embodiments, the same or equivalent parts are denoted by the same reference numerals for description.

First Embodiment

The following describes a first embodiment with reference to the drawings. A semiconductor wafer manufacturing apparatus according to the present embodiment is preferably applied to, for example, growing an epitaxial layer made of silicon carbide (SiC) on a surface of a base wafer to manufacture an SiC wafer. Hereinafter, a semiconductor wafer manufacturing apparatus (hereinafter, also simply referred to as a manufacturing apparatus) for manufacturing an SiC wafer will be described as an example of the semiconductor wafer manufacturing apparatus.

As shown in FIG. 1, a manufacturing apparatus 1 includes a chamber 20 that forms a reaction chamber 20a for growing an epitaxial layer 11 as a semiconductor layer on a front surface 10a of a base wafer 10. In the present embodiment, the chamber 20 corresponds to a reaction chamber forming member that forms the reaction chamber 20a.

A reactant gas supply pipe 30 configured to supply a reactant gas for growing a crystal thin film on the front surface 10a of the base wafer 10 is provided on an upper side of the chamber 20. In the present embodiment, in order to epitaxially grow SiC, the reactant gas includes, for example, a source gas including trichlorosilane ($SiHCl_3$) and propane ($C_3H_8$), a carrier gas including hydrogen and hydrogen chloride (HCl), and a dopant gas including nitrogen ($N_2$).

Specifically, the reactant gas supply pipe 30 is disposed on the upper side of the chamber 20 so that a position facing the front surface 10a of the base wafer 10 is opened. Accordingly, the reactant gas is supplied to the reaction chamber 20a from a direction intersecting the front surface 10a of the base wafer 10 (that is, a direction substantially perpendicular to the front surface 10a) toward the front surface 10a of the base wafer 10. Therefore, it can be said that the manufacturing apparatus 1 of the present embodiment has a downflow-type gas supply structure in which the reactant gas is blown down toward the front surface 10a of the base wafer 10.

Furthermore, a rotating device 40 to which the base wafer 10 is placed is disposed on a lower side of the reaction chamber 20a. In the present embodiment, the base wafer 10 is placed on a susceptor 50 disposed on the rotating device 40.

The rotating device 40 includes a cylindrical member 41, a rotating shaft 42, a driving unit 43, and the like. The cylindrical member 41 is a member having a bottomed cylindrical shape and forms a hollow chamber 41a, and the susceptor 50 is disposed at an opening end portion. The cylindrical member 41 is disposed such that the opening end portion faces the upper side of the chamber 20 (that is, the side of the reactant gas supply pipe 30). The cylindrical member 41 (that is, the hollow chamber 41a) is configured such that an inert gas, which will be described later, is introduced therein.

The rotating shaft 42 is a shaft that is rotated by an output of the driving unit 43, and is connected to the cylindrical member 41 so as to be rotatable integrally with the cylindrical member 41. The driving unit 43 includes a motor or the like that outputs a rotational force, and rotates the rotating shaft 42. In the rotating device 40 configured as described above, the rotating shaft 42 is rotated by the output of the driving unit 43, and the cylindrical member 41 and the susceptor 50 are integrally rotated.

Since the susceptor 50 is disposed in a high-temperature environment, the susceptor 50 is formed of, for example, isotropic graphite whose surface is coated with SiC, and has an outer shape matching the opening end portion of the cylindrical member 41. The susceptor 50 is disposed at the opening end portion of the cylindrical member 41 to substantially close the cylindrical member 41. Accordingly, the hollow chamber 41a of the cylindrical member 41 is substantially closed.

Figures 2, 3:
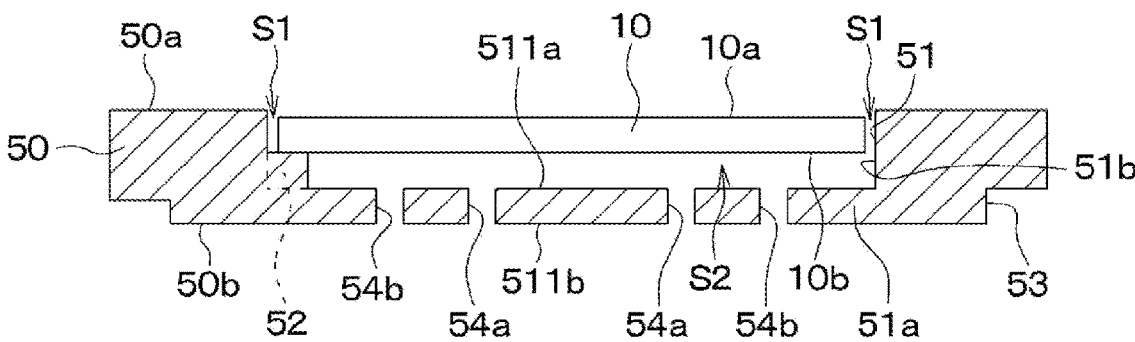
FIG. 2 is a cross-sectional view of a susceptor.
FIG. 3 is a plan view of the susceptor.

The shape of the susceptor 50 will be described with reference to FIG. 2 and FIG. 3. FIG. 2 corresponds to a cross section taken along line II-II in FIG. 3.

The susceptor 50 has a plate shape having a first surface 50a and a second surface 50b, and the first surface 50a has a recessed portion 51 for accommodating the base wafer 10. Specifically, the recessed portion 51 has a shape corresponding to the outer shape of the base wafer 10, and a planar shape of the recessed portion 51 is substantially circular shape. That is, a bottom part 51a of the recessed portion 51 has a substantially circular shape. The size of the recessed portion 51 is slightly larger than the size of the base wafer 10, and has such a size that a gap S1 is provided between a side surface 51b of the recessed portion 51 and the base wafer 10 when the base wafer 10 is placed.

A surface of the bottom part 51a located close to the first surface 50a of the susceptor 50 is referred to as a first surface 511a, and a surface of the bottom part 51a located close to the second surface 50b of the susceptor 50 is referred to as a second surface 511b. The susceptor 50 has support portions 52 on the bottom part 51a and the support portions 52 protrude in a normal direction to a plane direction of the first surface 511a. In the present embodiment, three support portions 52 are provided on an outer peripheral portion of the bottom part 51a, and are arranged apart from a center SC of the bottom part 51a (that is, the susceptor 50) to be evenly spaced from each other in a circumferential direction. The base wafer 10 is placed on the support portions 52 and accommodated in the recessed portion 51. Therefore, a space S2 is provided between the rear surface 10b of the base wafer 10 and the first surface 50a of the bottom part 51a of the susceptor 50.

The susceptor 50 also has a step portion 53 formed on the second surface so as to be fitted to the opening end portion of the cylindrical member 41. The susceptor 50 is disposed on the cylindrical member 41 by fitting the step portion 53 into the opening end portion of the cylindrical member 41. That is, the susceptor 50 is disposed such that the second surface 50b is exposed to the hollow chamber 41a and the first surface 50a is exposed to the reaction chamber 20a.

The susceptor 50 further has multiple through holes 54a and 54b penetrating through the bottom part 51a of the recessed portion 51. That is, the susceptor 50 has the multiple through holes 54a and 54b that communicate the hollow chamber 41a with the space S2. In the present embodiment, each of the through holes 54a and 54b is formed in a cylindrical shape. The through holes 54a and 54b are arranged concentrically. Hereinafter, the through holes 54a arranged along an inner concentric circle are also referred to inner peripheral through holes 54a, and the through holes 54b arranged along an outer concentric circle are also referred to as outer peripheral through holes 54b. The support portions 52 of the present embodiment are formed at positions closer to the outer peripheral end of the bottom part 51a than the outer peripheral through holes 54b. In other words, the support portions 52 are formed at positions between the outer peripheral through holes 54b and the outer peripheral end of the bottom part 51a in a radial direction. In addition, each of the through holes 54a and 54b of the present embodiment is formed so as to be parallel to the normal direction with respect to the plane direction of each of the first surface 511a and the second surface 511b.

As shown in FIG. 1, a heater 60 as a heating device for heating the base wafer 10 from a direction close to the rear surface 10b of the base wafer 10 is disposed in the hollow chamber 41a. As the heater 60, for example, a resistance heating heater made of carbon is used. Although not illustrated, the heater 60 is connected to a controller 110 and is heated to a predetermined temperature.

On the lower side of the chamber 20, a reactant gas discharge pipe 70 for discharging a gas after reaction or an unreacted gas is provided. A portion of the reactant gas discharge pipe 70 located opposite to the chamber 20 is connected to a vacuum pump 80. The reactant gas discharge pipe 70 is provided with a pressure detection unit 71 and a pressure adjustment valve 72 between the chamber 20 and the vacuum pump 80. The pressure in the reaction chamber 20a is adjusted to a specified pressure by adjusting an opening and closing degree of the pressure adjustment valve 72 based on a pressure detected by the pressure detection unit 71.

In the hollow chamber 41a, an inert gas supply pipe 90 for supplying the inert gas and an inert gas discharge pipe 100 for discharging the inert gas are disposed. The inert gas supply pipe 90 is provided with a mass flow controller 91 and supplies the inert gas into the hollow chamber 41a at a constant flow rate. Accordingly, after the inert gas is introduced into the hollow chamber 41a, the inert gas is introduced into the space S2 from the hollow chamber 41a through the through holes 54a and 54b of the susceptor 50, and the inert gas is supplied toward the rear surface 10b of the base wafer 10. Therefore, the reactant gas is restricted from flowing behind the rear surface of the base wafer 10. Examples of the inert gas include argon.

A portion of the inert gas discharge pipe 100 located opposite to the hollow chamber 41a is connected to the vacuum pump 80. The inert gas discharge pipe 100 is provided with a pressure detection unit 101 and a pressure adjustment valve 102 between the hollow chamber 41a and the vacuum pump 80. The pressure in the hollow chamber 41a is adjusted to a predetermined pressure by adjusting an opening and closing degree of the pressure adjustment valve 102 based on a pressure detected by the pressure detection unit 101. In the present embodiment, the inert gas supply pipe and the inert gas discharge pipe 100 are disposed in the cylindrical member 41 and communicate with the hollow chamber 41a.

The reactant gas discharge pipe 70 and the inert gas discharge pipe 100 of the present embodiment are partially connected to each other at a position opposite to the vacuum pump 80 across the respective pressure adjustment valves 72 and 102. The pressure detection unit 101 is disposed so as to detect a pressure difference at a connection portion between the reactant gas discharge pipe 70 and the inert gas discharge pipe 100. That is, the pressure detection unit 101 of the present embodiment detects the pressure difference between the pressure in the reaction chamber 20a and the pressure in the hollow chamber 41a.

Although not particularly illustrated, a susceptor lifting device is disposed in the hollow chamber 41a. The susceptor lifting device is configured to assist a transfer robot to load the susceptor 50 on which the base wafer 10 is placed into the reaction chamber 20a and to unload the susceptor 50 from the reaction chamber 20a. As the susceptor lifting and lowering device, for example, a device having a function of transferring the susceptor 50 to the transfer robot by raising the susceptor 50 and separating the susceptor 50 from the cylindrical member 41 when the susceptor 50 is transferred. However, the manufacturing apparatus 1 does not perform loading and unloading of the susceptor 50 on which the base wafer 10 is placed, and may perform loading and unloading of only the base wafer 10 without moving the susceptor 50.

The manufacturing apparatus 1 further includes the controller 110. The controller 110 is configured by a microcomputer or the like including a central processing unit (CPU), a storage unit configured by a non-transitory tangible storage medium such as a read-only memory (ROM), a random access memory (RAM), a flash memory, or a hard disk drive (HDD), and the like.

The controller 110 realizes various control operations by the CPU reading and executing various data from the storage unit. Specifically, the controller 110 adjusts the opening and closing degree of the pressure adjustment valve 72 based on the pressure of the pressure detection unit 71 so that the pressure in the reaction chamber 20a becomes a specified pressure. In addition, the controller 110 adjusts the opening and closing degree of the pressure adjustment valve 102 so that the pressure in the hollow chamber 41a becomes equal to or higher than the pressure in the reaction chamber 20a and equal to or lower than the predetermined pressure. In the present embodiment, since the pressure detection unit 101 is a differential pressure gauge, the controller 110 adjusts the opening and closing degree of the pressure adjustment valve 102 based on the result of the pressure detection unit 101.

The predetermined pressure is a pressure at which the base wafer 10 does not float (that is, the base wafer 10 is not separated from the susceptor 50) due to the pressure in the hollow chamber 41a. The predetermined pressure is appropriately changed according to the flow rate of the reactant gas, the mass of the base wafer 10, and the like.

The above is the configuration of the manufacturing apparatus 1 according to the present embodiment. Next, a method of growing the epitaxial layer 11 on the front surface 10a of the base wafer 10 using the manufacturing apparatus 1 will be described.

First, in the manufacturing apparatus 1, the reaction chamber 20a is heated to about 1600 to 1750° C. by the heater 60 while the susceptor 50 on which the base wafer 10 is placed is rotated at, for example, 200 rpm by the rotating device 40. In the manufacturing apparatus 1, the reactant gas is supplied from the reactant gas supply pipe 30 toward the reaction chamber 20a, and the inert gas is supplied from the inert gas supply pipe 90. As a result, the inert gas flows into the space S2 through the through holes 54a and 54b, and the epitaxial layer 11, which is a semiconductor layer, is formed on the front surface 10a of the base wafer 10 while restricting the reactant gas from flowing behind the rear surface 10b of the base wafer 10.

In the present embodiment, the pressure in the hollow chamber 41a is set to be equal to or higher than the pressure in the reaction chamber 20a. Therefore, the inert gas easily flows from the hollow chamber 41a (that is, the space S2) toward the reaction chamber 20a through the gap S1, and it is possible to effectively restrict the reactant gas from entering the hollow chamber 41a (that is, the space S2). In addition, the pressure in the hollow chamber 41a is equal to or lower than the predetermined pressure at which the base wafer 10 does not float due to the pressure in the hollow chamber 41a. Therefore, the epitaxial layer 11 can be formed without floating the base wafer 10.

Figure 4:
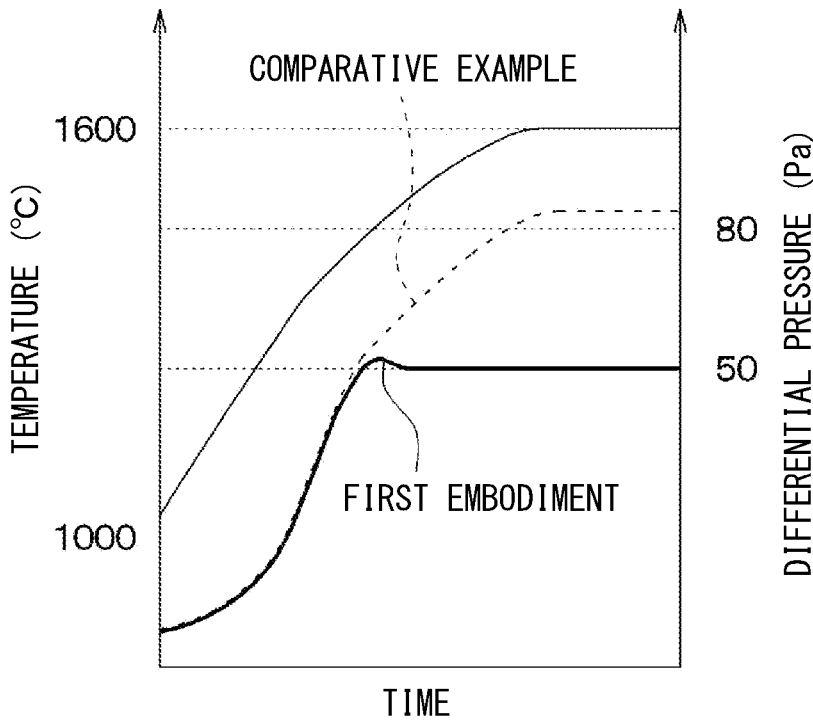
FIG. 4 is a diagram illustrating a relationship among time, temperature, and differential pressure.

The present embodiment will be compared with a comparative example in which the pressure in the hollow chamber 41a is not particularly controlled. As shown in FIG. 4, in the comparative example, since the inert gas expands with increase in temperature of the base wafer 10 (that is, increase in temperature in the hollow chamber 41a), the pressure in the hollow chamber 41a also increases. Thus, a differential pressure between the pressure in the hollow chamber 41a and the pressure in the reaction chamber 20a increases with increase in temperature of the base wafer 10, and there is a possibility that the growth of the epitaxial layer 11 cannot be appropriately performed due to the base wafer 10 floating from the susceptor 50 or the like.

In contrast, in the present embodiment, the opening and closing degree of the pressure regulating valve 102 is adjusted such that the pressure in the hollow chamber 41a is equal to or higher than the pressure in the reaction chamber 20a and the differential pressure is maintained at a predetermined pressure (for example, about pa). Therefore, it is possible to restrict the base wafer 10 from floating from the susceptor 50 due to an excessive increase in the pressure of the hollow chamber 41a, and it is possible to restrict the epitaxial layer 11 from not being grown appropriately.

The inert gas is, for example, argon, but may be helium or the like. The flow rate of the inert gas is, for example, 6 slm, but can be changed as appropriate. However, in a case where the flow rate of the inert gas is too small, there is a possibility that the change in the discharged amount becomes small even if the opening and closing degree of the pressure adjustment valve 102 is changed, and there is a possibility that it becomes difficult to adjust the pressure in the hollow chamber 41a by the pressure adjustment valve 102. Therefore, the flow rate of the inert gas is preferably at least 1 slm.

According to the present embodiment described above, the pressure in the hollow chamber 41a is set to be equal to or higher than the pressure in the reaction chamber 20a and equal to or lower than the predetermined pressure at which the base wafer 10 does not float. Therefore, floating or the like of the base wafer 10 during growth of the epitaxial layer 11 can be restricted, and growth of the epitaxial layer 11 can be suitably performed.

In the present embodiment, the through holes 54a and 54b are formed concentrically. Therefore, the inert gas can be easily introduced into the space S2.

Second Embodiment

The following describes a second embodiment. In the present embodiment, the shapes of the through holes 54a and 54b are changed from those in the first embodiment. The other configurations of the present embodiment are similar to those of the first embodiment, and therefore a description of the similar configurations will not be repeated.

Figure 5:
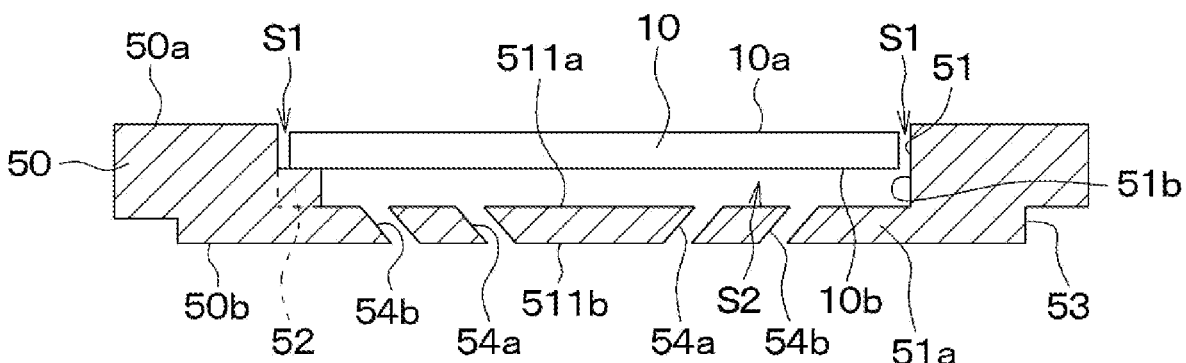
FIG. 5 is a cross-sectional view of a susceptor according to a second embodiment.

The susceptor 50 of the present embodiment is configured as shown in FIG. 5. Specifically, each of the through holes 54a and 54b is formed so as to be inclined toward the side surface 51b of the recessed portion 51 (that is, the outer peripheral end of the susceptor 50) in a direction from the second surface 511b to the first surface 511a of the bottom part 51a. That is, the through holes 54a and 54b are formed such that the flow direction of the inert gas is easily directed toward the side surface 51b of the recessed portion 51 when the inert gas flows from the hollow chamber 41a into the space S2.

According to the present embodiment described above, since the pressure in the hollow chamber 41a is set to be equal to or higher than the pressure in the reaction chamber 20a and equal to or lower than the predetermined pressure at which the base wafer 10 does not float, effects similar to those of the first embodiment can be obtained.

In the present embodiment, the through holes 54a and 54b are formed so as to be inclined toward the side surface 51b of the recessed portion 51 in the direction from the second surface 511b to the first surface 511a of the bottom part 51a. Therefore, the flow direction of the inert gas flowing into the space S2 from the hollow chamber 41a is more easily directed toward the side surface 51b of the recessed portion 51, and the inert gas more easily flows into the reaction chamber 20a through the gap S1 between the base wafer 10 and the side surface 51b of the recessed portion 51. Therefore, it is possible to further restrict the reactant gas from entering behind the rear surface 10*b* of the base wafer 10.

Figure 6:
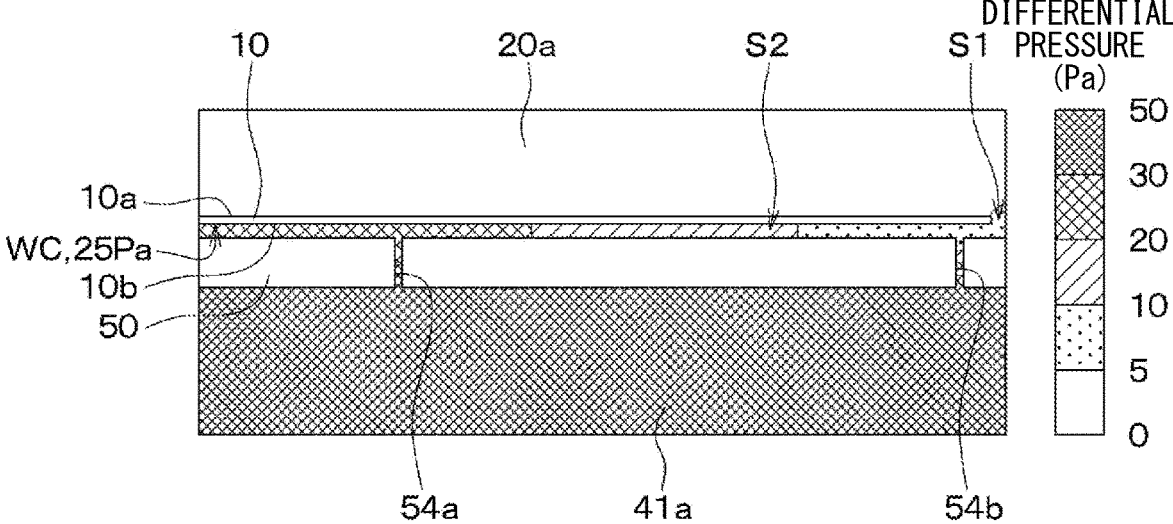
FIG. 6 is a diagram illustrating a simulation result regarding a differential pressure in the manufacturing apparatus according to the first embodiment.
Figure 7:
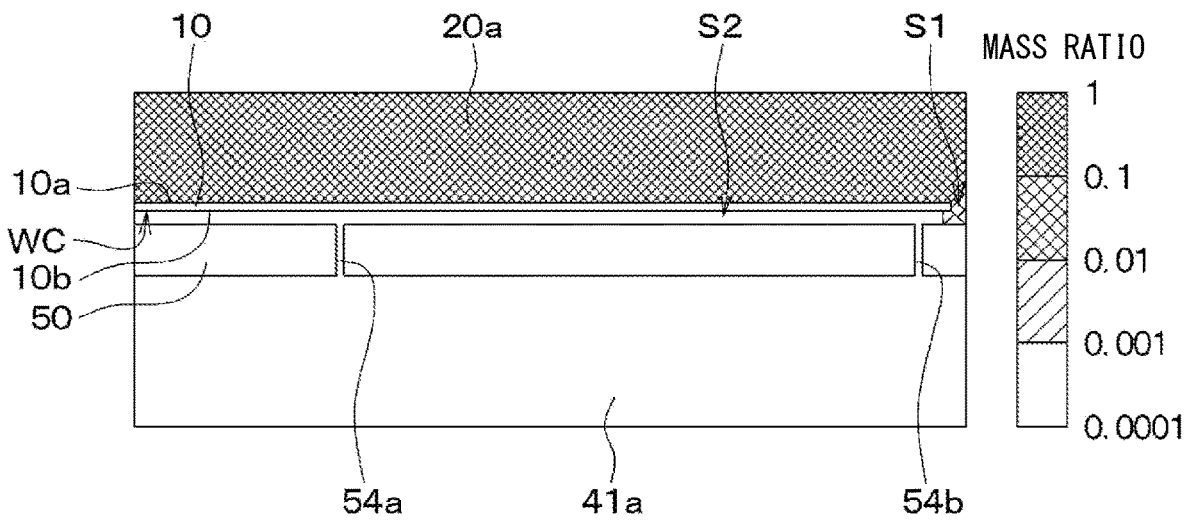
FIG. 7 is a diagram illustrating a simulation result regarding a mass ratio in the manufacturing apparatus according to the first embodiment.
Figure 8:
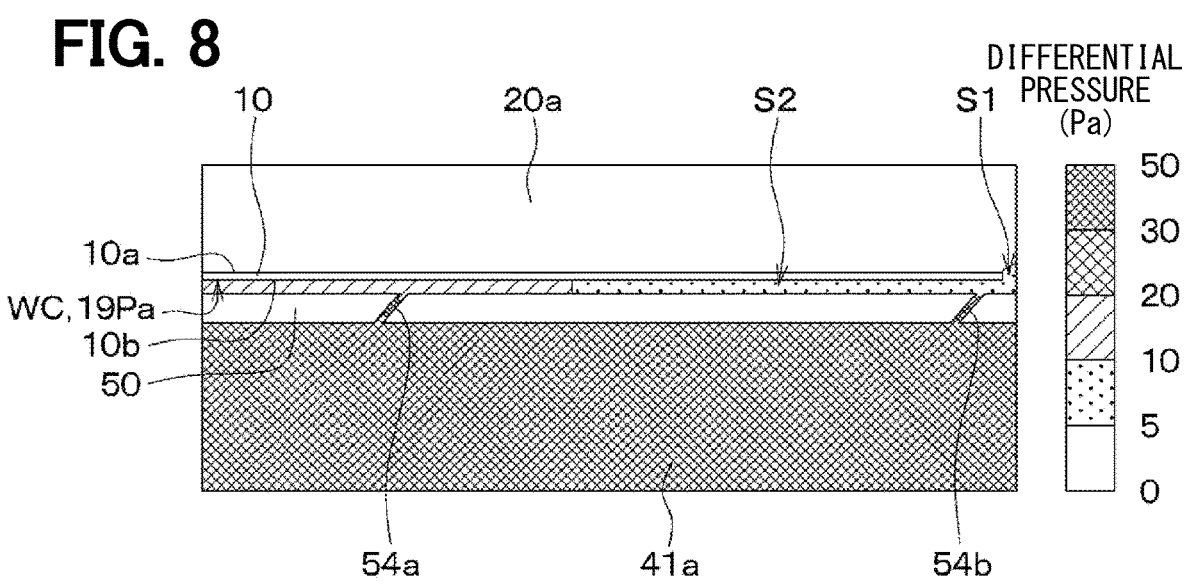
FIG. 8 is a diagram illustrating a simulation result regarding a differential pressure in a manufacturing apparatus according to the second embodiment.
Figure 9:
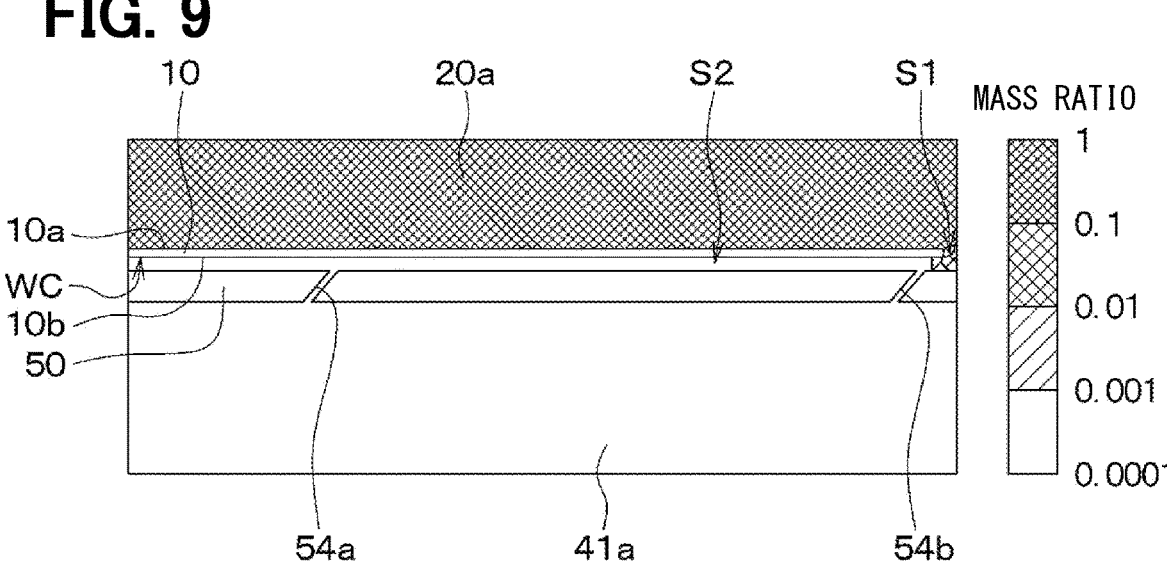
FIG. 9 is a diagram illustrating a simulation result regarding a mass ratio in the manufacturing apparatus according to the second embodiment.

Specifically, the present inventors performed simulations in which the reaction chamber 20*a* was heated to about 1600° C. by the heater 60 and the epitaxial layer 11 was grown under the following conditions, and obtained the results shown in FIGS. 6 to 9. In the simulation, the epitaxial layer 11 was grown under the condition that the pressure in the hollow chamber 41*a* is higher than the pressure in the reaction chamber 20*a* by about 50 Pa while the pressure in the reaction chamber 20*a* is constant at about 27 kPa. The space S2 communicates with the reaction chamber 20*a* through the through holes 54*a* and 54*b*, but has a lower pressure than the reaction chamber 20*a*. In this simulation, the flow rate of the reactant gas is 3 slm of trichlorosilane (SiHCl$_3$), 1 slm of propane (C$_3$H$_8$), 9 slm of hydrogen chloride (HCl), and 83 slm of hydrogen gas, and the flow rate of argon (Ar) as the inert gas is 6 slm. In FIG. 6 and FIG. 8, the differential pressure based on the pressure in the reaction chamber 20*a* is shown, and the differential pressure in the vicinity of the center WC of the rear surface 10*b* of the base wafer 10 is shown by a numerical value. In FIG. 7 and FIG. 9, the mass ratio of trichlorosilane is shown.

In the manufacturing apparatus 1 of the first embodiment in which the through holes 54*a* and 54*b* are parallel to the normal direction to the first surface 511*a* of the bottom part 51*a*, the results shown in FIG. 6 and FIG. 7 were obtained. That is, as shown in FIG. 6, it was confirmed that the pressure in the vicinity of the center WC of the rear surface 10*b* of the base wafer 10 was about 25 Pa higher than the pressure in the reaction chamber 20*a*. In addition, as shown in FIG. 7, the mass ratio of the trichlorosilane in the vicinity of the center WC of the rear surface 10*b* of the base wafer is 0.001 or less, and it was confirmed that the mass ratio can be sufficiently lower than the mass ratio of the trichlorosilane in the vicinity of the front surface 10*a* of the base wafer 10 (that is, 0.1 or more).

On the other hand, in the manufacturing apparatus 1 of the present embodiment, as shown in FIG. 8, it was confirmed that the pressure in the vicinity of the center WC of the rear surface 10*b* of the base wafer 10 was about 19 Pa higher than the pressure in the reaction chamber 20*a*. Furthermore, as shown in FIG. 9, it was confirmed that the mass ratio of the trichlorosilane in the vicinity of the center WC of the rear surface 10*b* of the base wafer 10 is 0.001 or less, and that the mass ratio can be sufficiently lower than the mass ratio of the trichlorosilane in the vicinity of the front surface 10*a* of the base wafer 10 (that is, 0.1 or more).

In other words, it was confirmed that, in the manufacturing apparatus 1 of the present embodiment, the inert gas easily flows into the reaction chamber 20*a* through the gap S1 between the base wafer 10 and the side surface 51*b* of the recessed portion 51.

Third Embodiment

The following describes a third embodiment. In the present embodiment, the shapes of the through holes 54*a* and 54*b* are changed from those in the second embodiment. The other configurations of the present embodiment are similar to those of the second embodiment, and therefore a description of the similar configurations will not be repeated.

Figure 10:
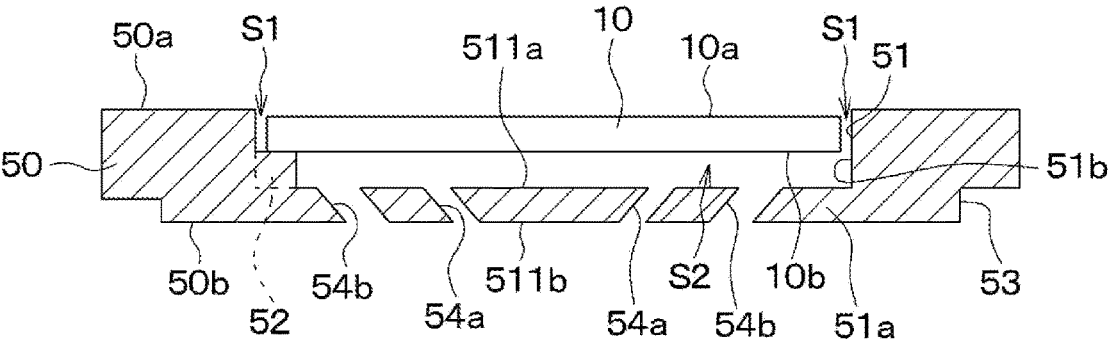
FIG. 10 is a cross-sectional view of a susceptor according to a third embodiment.

The susceptor 50 of the present embodiment is configured as shown in FIG. 10. Specifically, a distance of facing side surfaces of each of the outer peripheral through holes 54*b* is longer than that of each of the inner peripheral through holes 54*a*. In other words, each of the outer peripheral through holes 54*b* has a larger diameter than each of the inner peripheral through holes 54*a*. In other words, each of the outer peripheral through holes 54*b* has a larger cross-sectional area than each of the inner peripheral through holes 54*a*.

According to the present embodiment described above, since the pressure in the hollow chamber 41*a* is set to be equal to or higher than the pressure in the reaction chamber 20*a* and equal to or lower than the predetermined pressure at which the base wafer 10 does not float, effects similar to those of the first embodiment can be obtained.

In the present embodiment, the distance of the facing side surfaces of each of the outer peripheral through holes 54*b* is longer than that of each of the inner peripheral through holes 54*a*. Therefore, the inert gas flowing from the hollow chamber 41*a* into the space S2 more easily flows from the outer peripheral through hole 54*b* close to the gap S1 between the base wafer 10 and the side surface 51*b* of the recessed portion 51, and more easily flows into the reaction chamber 20*a* through the gap S1. Therefore, it is possible to further restrict the reactant gas from entering behind the rear surface 10*b* of the base wafer 10.

Figures 11, 12, 13:
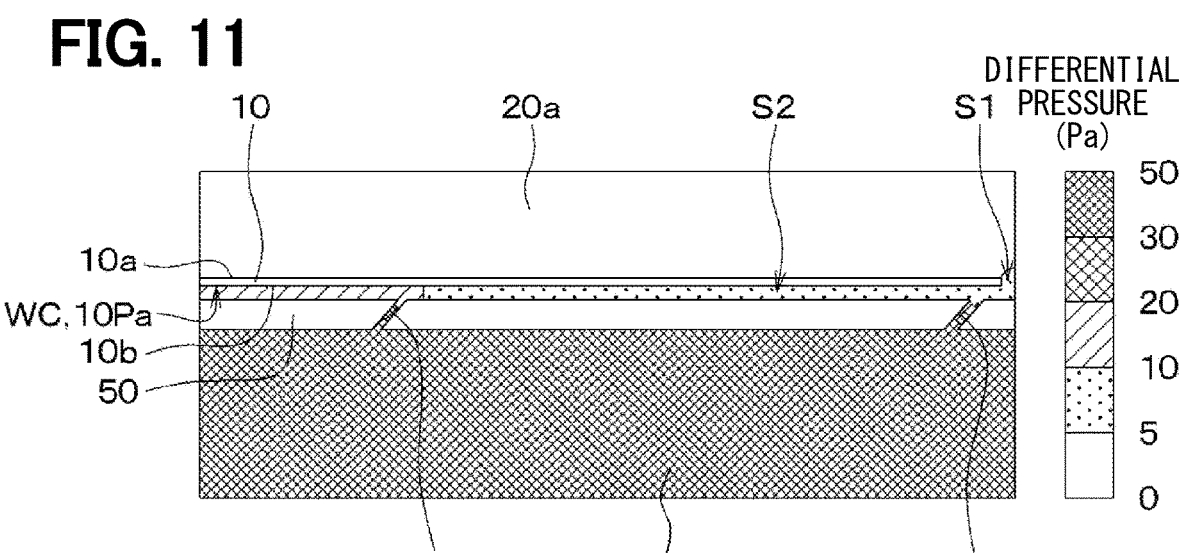
FIG. 11 is a diagram illustrating a simulation result regarding a differential pressure in a manufacturing apparatus according to the third embodiment.
FIG. 12 is a diagram illustrating a simulation result regarding a mass ratio in the manufacturing apparatus according to the third embodiment.
FIG. 13 is a cross-sectional view of a susceptor according to a fourth embodiment.

Specifically, the present inventors performed simulations under the same conditions as in the second embodiment, and obtained the results shown in FIG. 11 and FIG. 12. FIG. 11 and FIG. 12 show simulation results in which the distance of the facing side surfaces of each of the outer peripheral through holes 54*b* is twice the distance of the facing side surfaces of each of the inner peripheral through hole 54*a*, that is, the cross-sectional area of each of the outer peripheral through holes 54*b* is twice the cross-sectional area of each of the inner peripheral through hole 54*a*. In addition, FIG. 11 shows the differential pressure based on the pressure in the reaction chamber 20*a*, and shows the differential pressure in the vicinity of the center WC of the rear surface 10*b* of the base wafer 10 by a numerical value. FIG. 12 shows the mass ratio of trichlorosilane.

In the manufacturing apparatus 1 of the present embodiment, as shown in FIG. 11, it was confirmed that the pressure in the vicinity of the center WC on the rear surface 10*b* of the base wafer 10 was about 10 Pa higher than the pressure in the reaction chamber 20*a*. Furthermore, as shown in FIG. 12, it was confirmed that the mass ratio of the trichlorosilane in the vicinity of the center WC on the rear surface 10*b* of the base wafer 10 is 0.001 or less, and that the mass ratio can be sufficiently lower than the mass ratio of the trichlorosilane in the vicinity of the front surface 10*a* of the base wafer 10 (that is, 0.1 or more).

In other words, it was confirmed that, in the manufacturing apparatus 1 of the present embodiment, the inert gas easily flows into the reaction chamber 20*a* through the gap S1 between the base wafer 10 and the side surface 51*b* of the recessed portion 51.

Fourth Embodiment

The following describes a fourth embodiment. The present embodiment is different from the third embodiment in the shape of the susceptor 50. The other configurations of the present embodiment are similar to those of the third embodiment, and therefore a description of the similar configurations will not be repeated.

As shown in FIG. 13, the susceptor 50 of the present embodiment has a shape in which an inner peripheral portion of the bottom part 51*a* of the recessed portion 51 bulges in a direction from the first surface 50*a* to the second surface 50*b* compared with an outer peripheral portion of the bottom part 51*a*. Therefore, when the base wafer 10 is placed in the recessed portion 51 of the susceptor 50, a distance d1 between the center WC of the rear surface 10*b* of the base wafer 10 and the first surface 511*a* of the bottom part 51*a* is wider than a distance d2 between the outer peripheral portion of the rear surface 10*b* of the base wafer 10 and the first surface 511*a* of the bottom part 51*a*. In other words, a distance between the rear surface 10*b* of the base wafer 10 and a portion of the bottom part 51*a* where each of the inner peripheral through holes 54*a* is formed is wider than a distance between the rear surface 10*b* of the base wafer 10 and a portion of the bottom part 51*a* where each of the outer peripheral through holes 54*b* is formed.

According to the present embodiment described above, since the pressure in the hollow chamber 41*a* is set to be equal to or higher than the pressure in the reaction chamber 20*a* and equal to or lower than the predetermined pressure at which the base wafer 10 does not float, effects similar to those of the first embodiment can be obtained.

In the present embodiment, the susceptor 50 has a shape in which the inner peripheral portion of the bottom part 51*a* bulges in the direction from the first surface to the second surface 50*b* compared with the outer peripheral portion of the bottom part 51*a*. Thus, the distance between the rear surface 10*b* of the base wafer 10 and the portion of the bottom part 51*a* where each of the inner peripheral through holes 54*a* is formed is wider than the distance between the rear surface 10*b* of the base wafer 10 and the portion of the bottom part 51*a* where each of the outer peripheral through holes 54*b* is formed. Therefore, the inert gas flowing into the space S2 from the outer peripheral through holes 54*b* more easily flows into the reaction chamber 20*a* through the gap S1 between the base wafer 10 and the side surface 51*b* of the recessed portion 51. Accordingly, it is possible to further restrict the reactant gas from entering behind the rear surface 10*b* of the base wafer 10.

Figure 14:
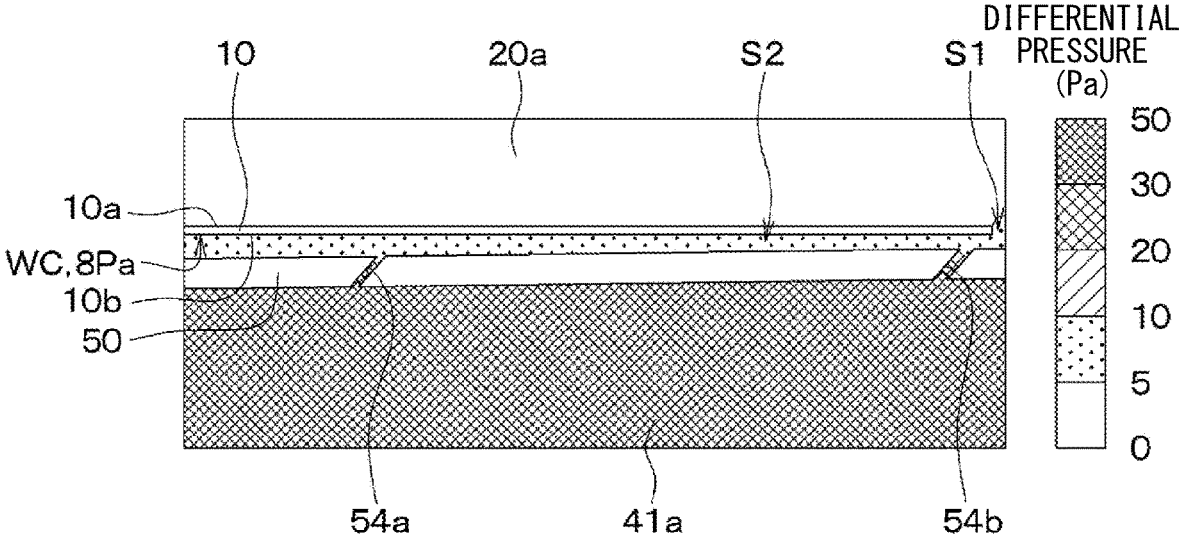
FIG. 14 is a diagram illustrating a simulation result regarding a differential pressure in a manufacturing apparatus according to the fourth embodiment.
Figure 15:
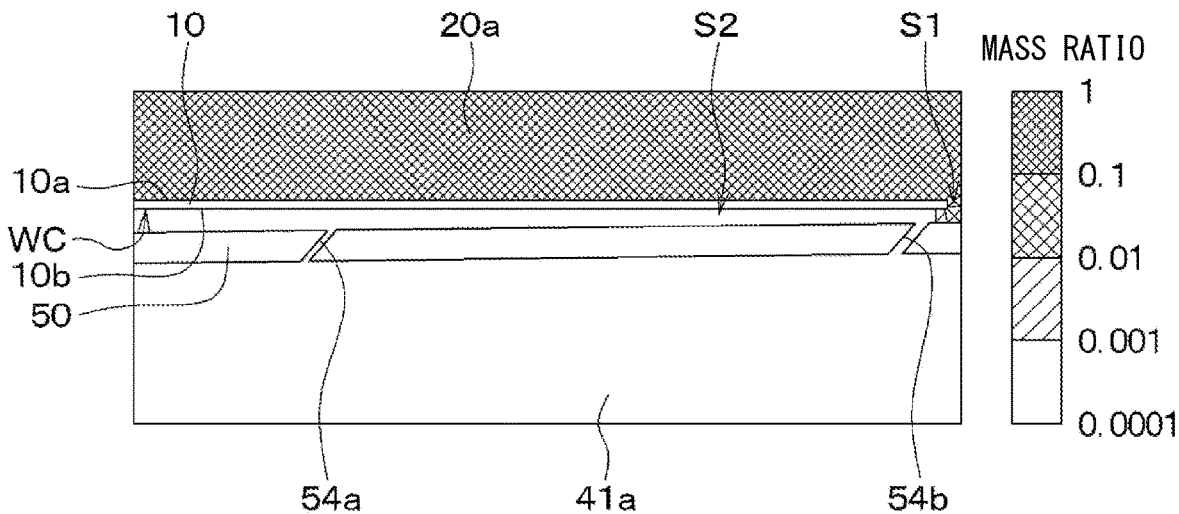
FIG. 15 is a diagram illustrating a simulation result regarding a mass ratio in the manufacturing apparatus according to the fourth embodiment.

Specifically, the present inventors performed simulations under the same conditions as in the third embodiment, and obtained the results shown in FIG. 14 and FIG. 15. FIG. 14 and FIG. 15 show simulation results in which the distance d1 is twice the distance d2. In addition, FIG. 14 shows the differential pressure based on the pressure in the reaction chamber 20*a*, and shows the differential pressure in the vicinity of the center WC of the rear surface 10*b* of the base wafer 10 by a numerical value. FIG. 15 shows the mass ratio of trichlorosilane in the reaction chamber 20*a*.

In the manufacturing apparatus 1 of the present embodiment, as shown in FIG. 14, it was confirmed that the pressure in the vicinity of the center WC on the rear surface 10*b* of the base wafer 10 was about 8 Pa higher than the pressure in the reaction chamber 20*a*. Furthermore, as shown in FIG. 15, it was confirmed that the mass ratio of the trichlorosilane in the vicinity of the center WC on the rear surface 10*b* of the base wafer 10 is 0.001 or less, and that the mass ratio can be sufficiently lower than the mass ratio of the trichlorosilane in the vicinity of the front surface 10*a* of the base wafer 10 (that is, 0.1 or more).

In other words, it was confirmed that, in the manufacturing apparatus 1 of the present embodiment, the inert gas easily flows into the reaction chamber 20*a* through the gap S1 between the base wafer 10 and the side surface 51*b* of the recessed portion 51.

Fifth Embodiment

The following describes a fifth embodiment. The present embodiment is different from the third embodiment in the shape of the susceptor 50. The other configurations of the present embodiment are similar to those of the third embodiment, and therefore a description of the similar configurations will not be repeated.

Figures 16, 17:
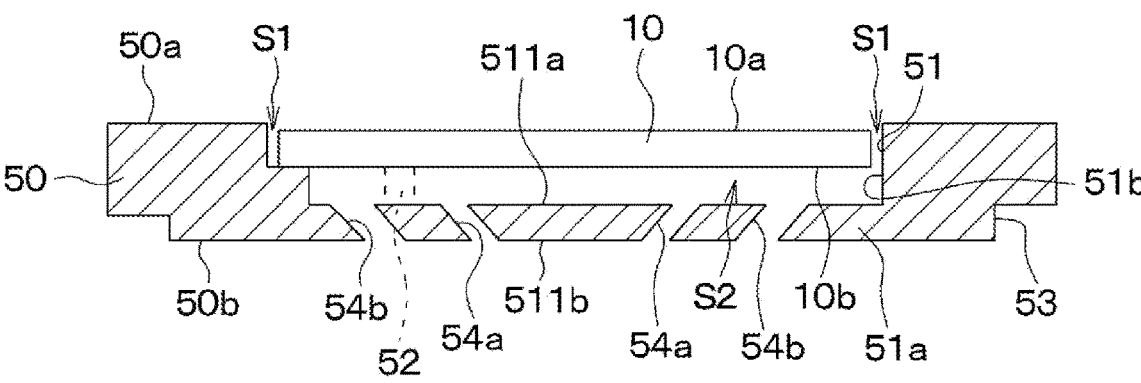
FIG. 16 is a cross-sectional view of a susceptor according to a fifth embodiment.
FIG. 17 is a plan view of the susceptor according to the fifth embodiment.

In the susceptor 50 of the present embodiment, as shown in FIG. 16 and FIG. 17, the support portions 52 are formed at positions of the bottom part 51*a* between the outer peripheral through hole 54*b* and the inner peripheral through hole 54*a*. In other words, the outer peripheral through holes 54*b* are formed at positions closer to the outer peripheral end of the bottom part 51*a* of the recessed portion 51 than the support portions 52. Thus, the outer peripheral through hole 54*b* is formed closer to the outer peripheral end of the bottom part 51*a* of the recessed portion 51 as compared with the third embodiment. In the present embodiment, a distance from a center SC of the bottom part 51*a* to each of the outer peripheral through holes 54*b* is longer than that in the third embodiment. FIG. 16 is a cross-sectional view of the susceptor 50 taken along line XVI-XVI in FIG. 17.

According to the present embodiment described above, since the pressure in the hollow chamber 41*a* is set to be equal to or higher than the pressure in the reaction chamber 20*a* and equal to or lower than the predetermined pressure at which the base wafer 10 does not float, effects similar to those of the first embodiment can be obtained.

In the present embodiment, the outer peripheral through holes 54*b* are formed at the positions closer to the outer peripheral end of the bottom part 51*a* of the recessed portion 51 than the support portions 52. Therefore, the inert gas flowing into the space S2 from the outer peripheral through holes 54*b* more easily flows into the reaction chamber 20*a* through the gap S1 between the base wafer 10 and the side surface 51*b* of the recessed portion 51. Therefore, it is possible to further restrict the reactant gas from entering behind the rear surface 10*b* of the base wafer 10.

Figure 18:
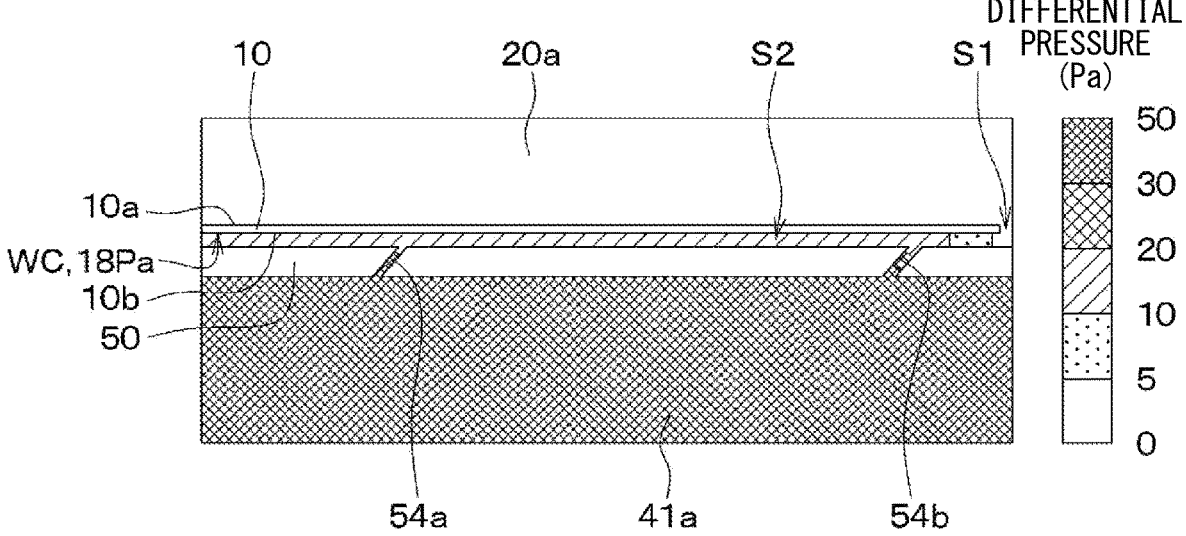
FIG. 18 is a diagram illustrating a simulation result regarding a differential pressure in a case where a distance from a center of a bottom part to each of outer peripheral through holes is set to 65 mm.
Figure 19:
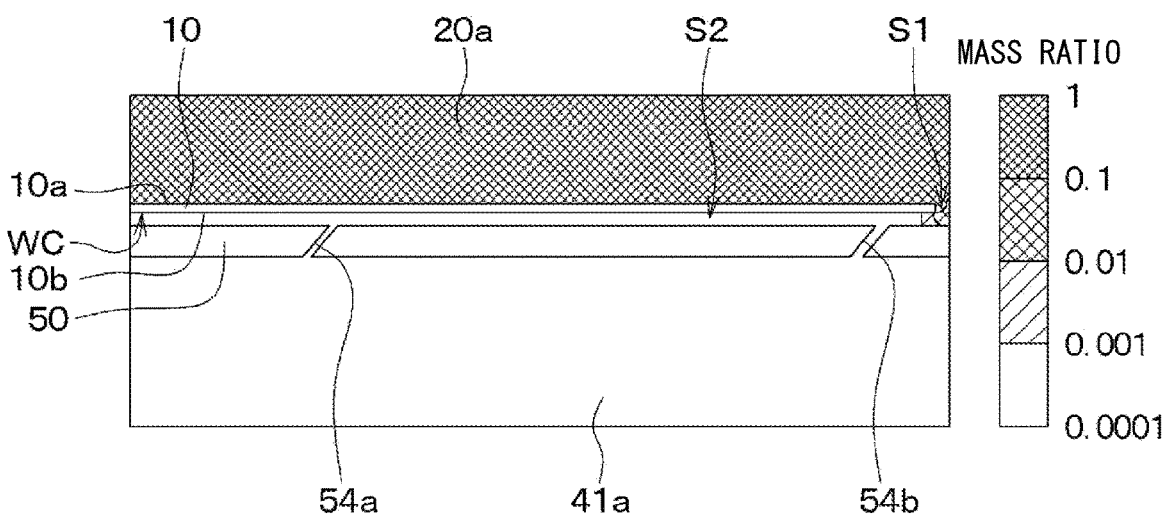
FIG. 19 is a diagram illustrating a simulation result regarding a mass ratio in the case where the distance from the center of the bottom part to each of the outer peripheral through holes is set to 65 mm.
Figure 20:
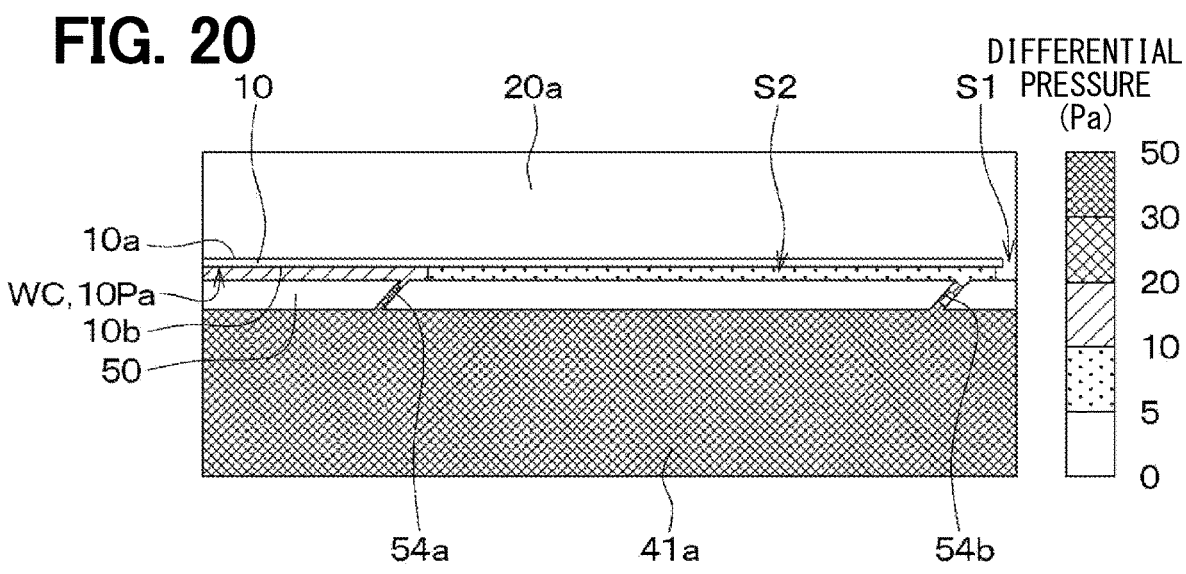
FIG. 20 is a diagram illustrating a simulation result regarding a differential pressure in a case where the distance from the center of the bottom part to each of the outer peripheral through holes is set to 70 mm.
Figure 21:
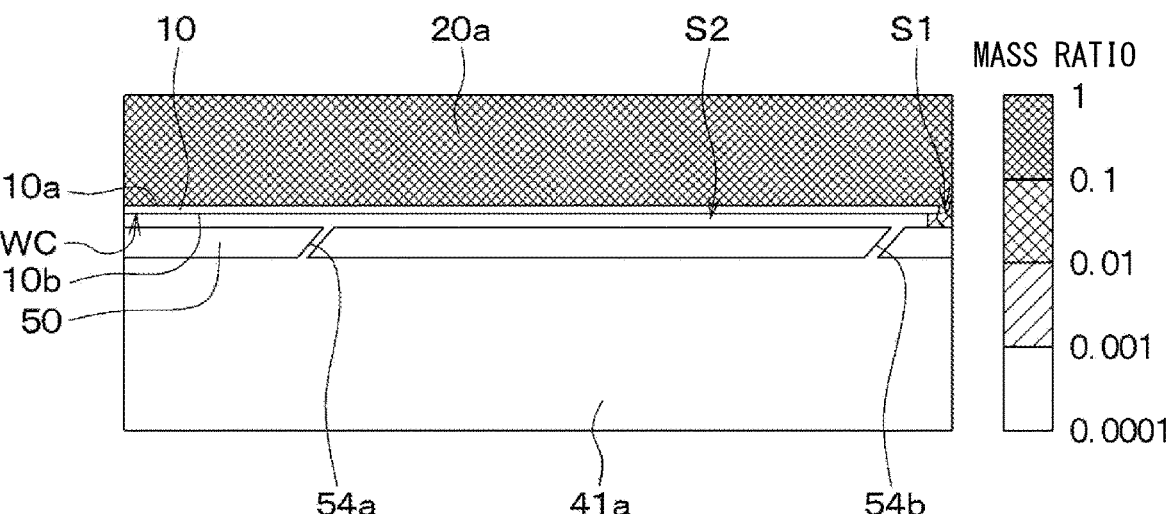
FIG. 21 is a diagram illustrating a simulation result regarding a mass ratio in the case where the distance from the center of the bottom part to each of the outer peripheral through holes is set to 70 mm.

Specifically, the present inventors performed simulations under the same conditions as in the third embodiment, and obtained the results shown in FIGS. 18 to 21. FIG. 18 and FIG. 19 show the results in a case where the distance from the center SC of the bottom part 51*a* to each of the outer peripheral through holes 54*b* is 65 mm. FIG. 20 and FIG. 21 show the results in a case where the distance from the center SC of the bottom part 51*a* to each of the outer peripheral through holes 54*b* is 70 mm.

First, in the manufacturing apparatus 1 in which the distance from the center SC of the bottom part 51*a* to each of the outer peripheral through holes 54*b* was set to mm, as shown in FIG. 18, it was confirmed that the pressure in the vicinity of the center WC of the rear surface 10*b* of the base wafer 10 was about 18 Pa higher than the pressure in the reaction chamber 20*a*. Furthermore, as shown in FIG. 19, it was confirmed that the mass ratio of the trichlorosilane in the vicinity of the center WC of the rear surface 10*b* of the base wafer 10 is 0.001 or less, and that the mass ratio can be sufficiently lower than the mass ratio of the trichlorosilane in the vicinity of the front surface 10*a* of the base wafer 10 (that is, 0.1 or more).

On the other hand, in the manufacturing apparatus 1 in which the distance from the center SC of the bottom part 51*a* to each of the outer peripheral through holes 54*b* was set to 70 mm, as shown in FIG. 20, it was confirmed that the pressure in the vicinity of the center WC of the rear surface 10*b* of the base wafer 10 was about 10 Pa higher than the pressure in the reaction chamber 20*a*. Furthermore, as shown in FIG. 21, it was confirmed that the mass ratio of the trichlorosilane in the vicinity of the center WC of the rear surface 10*b* of the base wafer 10 is 0.001 or less, and that the mass ratio can be sufficiently lower than the mass ratio of the trichlorosilane in the vicinity of the front surface 10a of the base wafer 10 (that is, 0.1 or more).

In other words, it was confirmed when the distance from the center SC of the bottom part 51a to each of the outer peripheral through holes 54b is increased, the reactant gas more easily flows into the reaction chamber 20a through the gap S1 between the base wafer 10 and the side surface 51b of the recessed portion 51. Therefore, by forming the outer peripheral through holes 54b at positions closer to the outer peripheral end than the support portions 52 as in the present embodiment, the distance from the center SC of the bottom part 51a to each of the outer peripheral through holes 54b can be easily increased, and the reactant gas can more easily flow into the reaction chamber 20a through the gap S1.

Sixth Embodiment

The following describes a sixth embodiment. The present embodiment is different from the third embodiment in the shape of the susceptor 50. The other configurations of the present embodiment are similar to those of the third embodiment, and therefore a description of the similar configurations will not be repeated.

Figure 22:
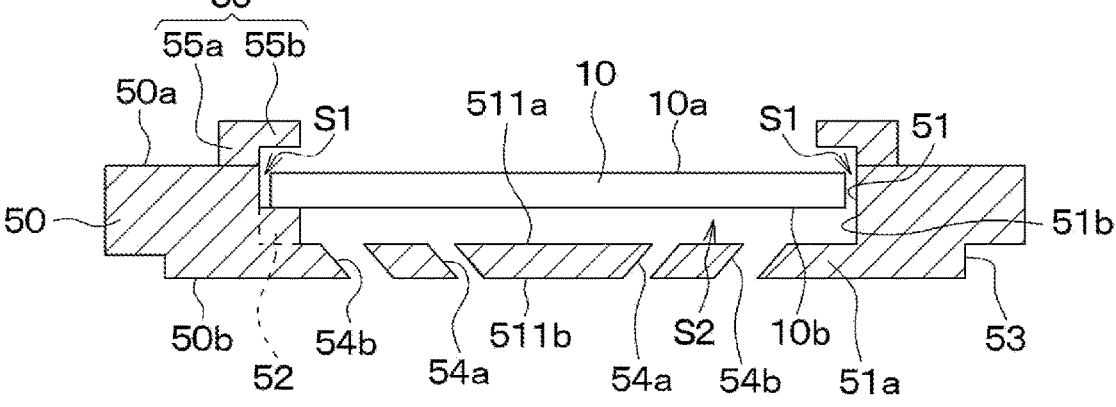
FIG. 22 is a cross-sectional view of a susceptor according to a sixth embodiment.

The susceptor 50 of the present embodiment has, as shown in FIG. 22, suppressing portions 55 on the first surface 50a around the recessed portion 51. Specifically, the suppressing portions 55 have portions protruding to overlap with the recessed portion 51 in the normal direction of the first surface 50a of the susceptor 50, and are configured not to come into contact with the epitaxial layer 11 when the base wafer 10 is placed and the epitaxial layer 11 is grown. In the present embodiment, each of the suppressing portions 55 has a base portion 55a extending in the normal direction of the first surface 50a and a protruding portion 55b protruding from the base portion 55a toward the recessed portion 51. For example, three suppressing portions 55 are formed around the recessed portion 51 to be evenly spaced from each other in the circumferential direction.

According to the present embodiment described above, since the pressure in the hollow chamber 41a is set to be equal to or higher than the pressure in the reaction chamber 20a and equal to or lower than the predetermined pressure at which the base wafer 10 does not float, effects similar to those of the first embodiment can be obtained.

In the present embodiment, the suppressing portions 55 are disposed on the first surface 50a of the susceptor 50. Therefore, even if the base wafer 10 floats, it is possible to suppress the base wafer 10 from falling from the susceptor 50 by the suppressing portions 55, and it is possible to restrict the occurrence of a failure or the like of the manufacturing apparatus 1.

OTHER EMBODIMENTS

Although the present disclosure has been described in accordance with the embodiments, it is understood that the present disclosure is not limited to such embodiments or structures. The present disclosure encompasses various modifications and variations within the scope of equivalents. Furthermore, various combinations and modes, and other combination and modes including only one, more or less element, fall within the spirit and scope of the present disclosure.

For example, in each of the above embodiments, the manufacturing apparatus 1 for growing the SiC epitaxial layer 11 has been described as an example. However, the configuration of the epitaxial layer 11 to be grown can be appropriately changed, and for example, the manufacturing apparatus 1 may grow the epitaxial layer 11 of gallium nitride.

In each of the above embodiments, an example has been described in which the pressure detection unit 101 that detects the pressure in the hollow chamber 41a detects the differential pressure between the hollow chamber 41a and the reaction chamber 20a. However, the pressure of the hollow chamber 41a may be detected by the pressure detection unit 101, and the differential pressure between the reaction chamber 20a and the hollow chamber 41a may be derived by the controller 110. However, in order to restrict the base wafer 10 from floating or the like while restricting the reactant gas from entering behind the rear surface 10b of the base wafer 10, detailed pressure management is required. Therefore, it is preferable that the pressure detection unit 101 directly detects the differential pressure between the reaction chamber 20a and the hollow chamber 41a.

In each of the above embodiments, an example in which the through holes 54a and 54b are formed concentrically has been described, but the arrangement of the through holes 54a and 54b can be appropriately changed.

In addition, each of the above embodiments can be combined as appropriate. For example, in the third to sixth embodiments, as in the first embodiment, the through holes 54a and 54b may be formed so as to be parallel to the normal direction to the first surface 511a of the bottom part 51a. In addition, the third to fifth embodiments may be appropriately combined so that the inert gas can more easily flow into the reaction chamber 20a from the gap S1.

The controller and the method thereof described in the present disclosure are implemented by a dedicated computer provided by configuring a processor and a memory programmed to execute one or more functions embodied by a computer program. Alternatively, the controller and the method described in the present disclosure may be implemented by a special purpose computer configured as a processor with one or more special purpose hardware logic circuits. Alternatively, the controller and the method described in the present disclosure may be implemented by one or more special purpose computer, which is configured as a combination of a processor and a memory, which are programmed to perform one or more functions, and a processor which is configured with one or more hardware logic circuits. The computer program may be stored, as instructions to be executed by a computer, in a tangible non-transitory computer-readable medium.

What is claimed is:

1. A semiconductor wafer manufacturing apparatus comprising:

a reaction chamber forming member that forms a reaction chamber into which a reactant gas is to be introduced and in which an epitaxial layer is to be grown on a front surface of a base wafer;

a reactant gas supply pipe communicated with the reaction chamber and configured to supply the reactant gas for growing the epitaxial layer to the reaction chamber;

a reactant gas discharge pipe communicated with the reaction chamber and configured to discharge an unreacted gas from the reaction chamber;

a susceptor disposed in the reaction chamber and on which the base wafer is to be placed;

a rotating device having a cylindrical member with one end portion on which the susceptor is disposed and configured to rotate the susceptor together with the base wafer, a space surrounded by the cylindrical member and the susceptor being defined as a hollow chamber;

an inert gas supply pipe communicated with the hollow chamber and configured to introduce an inert gas into the hollow chamber;

an inert gas discharge pipe communicated with the hollow chamber and configured to discharge the inert gas; and a controller configured to adjust an amount of the inert gas discharged from the inert gas discharge pipe such that a pressure in the hollow chamber is higher than a pressure in the reaction chamber and equal to or lower than a predetermined pressure, wherein the susceptor has a plate shape having a first surface and a second surface opposite to the first surface, and is disposed on the cylindrical member in such a manner that the first surface faces the reaction chamber and the second surface faces the hollow chamber, the susceptor has a recessed portion for accommodating the base wafer on the first surface, and the recessed portion has such a size that a gap is provided between a side surface of the recessed portion and the base wafer, and the recessed portion has a bottom part and has at least one through hole penetrating through the bottom part.

2. The semiconductor wafer manufacturing apparatus according to claim 1, wherein the at least one through hole includes a plurality of through holes each having a cylindrical shape, and the plurality of through holes is arranged concentrically with respect to a center of the bottom part.

3. The semiconductor wafer manufacturing apparatus according to claim 2, wherein each of the plurality of through holes is inclined toward an outer peripheral end of the susceptor in a direction from the second surface to the first surface of the susceptor.

4. The semiconductor wafer manufacturing apparatus according to claim 2, wherein the plurality of through holes includes an inner peripheral through hole and an outer peripheral through hole, the inner peripheral through hole is located closer to the center of the bottom part than the outer peripheral through hole, and a distance between facing side surfaces of the outer peripheral through hole is longer than a distance between facing side surfaces of the inner peripheral through hole.

5. The semiconductor wafer manufacturing apparatus according to claim 2, wherein the susceptor has a support portion on the bottom part of the recessed portion, the support portion protrudes in a normal direction to a plane direction of the bottom part and is configured to support the base wafer, and the bottom part of the susceptor bulges in a direction from the first surface to the second surface of the susceptor such that a distance between an inner peripheral portion of the base wafer and the bottom part is longer than a distance between an outer peripheral portion of the base wafer and the bottom part in a state where the base wafer is placed on the support portion.

6. The semiconductor wafer manufacturing apparatus according to claim 2, wherein the susceptor has a support portion on the bottom part of the recessed portion, the support portion protrudes in a normal direction to a plane direction of the bottom part and is configured to support the base wafer, and at least a part of the plurality of through holes is located closer to an outer peripheral end of the bottom part than the support portion.

7. The semiconductor wafer manufacturing apparatus according to claim 1, wherein the susceptor has a suppressing portion on the first surface around the recessed portion, the suppressing portion has a protruding portion that protrudes to overlap with the recessed portion in a normal direction of the first surface, and the suppressing portion is configured not to come into contact with the epitaxial layer when the epitaxial layer is grown on the base wafer.

8. The semiconductor wafer manufacturing apparatus according to claim 1, wherein the predetermined pressure is a pressure at which the base wafer does not float due to the pressure in the hollow chamber.

9. The semiconductor wafer manufacturing apparatus according to claim 1, wherein the predetermined pressure is a pressure at which the base wafer is not separated from the susceptor due to the pressure in the hollow chamber.

10. The semiconductor wafer manufacturing apparatus according to claim 1, wherein the inert gas discharge pipe and the reactant gas discharge pipe are connected to a vacuum pump.

11. The semiconductor wafer manufacturing apparatus according to claim 1, further comprising a pressure detector configured to detect a pressure difference between the pressure in the reaction chamber and the pressure in the hollow chamber.

* * * * *